(12) United States Patent
Bohra et al.

(10) Patent No.: US 9,374,910 B2
(45) Date of Patent: Jun. 21, 2016

(54) PRINTED CIRCUIT BOARD COPPER PLANE REPAIR

(71) Applicant: International Business Machines Corporation, Armonk, NY (US)

(72) Inventors: Mahesh Bohra, Austin, TX (US); Sungjun Chun, Austin, TX (US); Jesus Montanez, Austin, TX (US); Daniel I. Rodriguez, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 14/145,190

(22) Filed: Dec. 31, 2013

(65) Prior Publication Data

US 2015/0189754 A1 Jul. 2, 2015

(51) Int. Cl.
| | |
|---|---|
| H05K 1/11 | (2006.01) |
| H05K 1/09 | (2006.01) |
| H05K 1/16 | (2006.01) |
| H05K 3/32 | (2006.01) |
| H05K 1/02 | (2006.01) |
| H05K 3/00 | (2006.01) |
| H05K 3/22 | (2006.01) |
| H05K 1/18 | (2006.01) |

(52) U.S. Cl.
CPC .............. *H05K 3/325* (2013.01); *H05K 1/0251* (2013.01); *H05K 1/115* (2013.01); *H05K 3/0047* (2013.01); *H05K 3/22* (2013.01); *H05K 1/183* (2013.01); *H05K 2201/09845* (2013.01); *H05K 2203/0207* (2013.01); *Y10T 29/49126* (2015.01); *Y10T 156/1056* (2015.01)

(58) Field of Classification Search
CPC ........ H05K 1/144; H05K 1/115; H05K 3/0044
USPC .................................. 174/251, 260, 262–266
See application file for complete search history.

(56) References Cited

U.S. PATENT DOCUMENTS

| | | | | |
|---|---|---|---|---|
| 6,303,879 | B1 * | 10/2001 | Burkhart | ............... C04B 37/026 174/261 |
| 6,504,111 | B2 | 1/2003 | Curcio et al. | |
| 6,632,512 | B1 * | 10/2003 | Ito | ........................ H01L 21/6833 174/252 |
| 6,812,411 | B2 | 11/2004 | Belau et al. | |

(Continued)

FOREIGN PATENT DOCUMENTS

| | | |
|---|---|---|
| JP | 04348595 A | 12/1992 |
| JP | 4348595 B2 | 10/2009 |

OTHER PUBLICATIONS

Bohra et al., "Printed Circuit Board Copper Plane Repair," U.S. Appl. No. 14/732,885, filed Jun. 8, 2015.

(Continued)

*Primary Examiner* — Sherman Ng
(74) *Attorney, Agent, or Firm* — Richard A. Wilhelm; Joseph Petrokaitis

(57) ABSTRACT

A device has a base with a mounting surface with a length and a stack, the stack having a diameter smaller than the length and fastened to the mounting surface. The stack may have a plurality of stack conductive layers in addition to a plurality of insulating layers that separate each of the plurality of stack conductive layers. The stack conductive layers may be separated in a manner that aligns them with corresponding printed circuit board conductive layers when the stack portion of the device is inserted into an aperture in a printed circuit board.

11 Claims, 7 Drawing Sheets

(56) References Cited

U.S. PATENT DOCUMENTS

| | | |
|---|---|---|
| 6,991,497 B1 | 1/2006 | Lin |
| 7,076,869 B2 | 7/2006 | Curcio et al. |
| 7,351,065 B1 | 4/2008 | Merrell et al. |
| 7,570,493 B2 | 8/2009 | Karlsson |
| 7,790,985 B2 | 9/2010 | Palmeri et al. |
| 7,898,811 B2 | 3/2011 | Storey |
| 2002/0196613 A1* | 12/2002 | Seki ........................ H05K 1/184 361/761 |
| 2005/0286238 A1 | 12/2005 | Joy |
| 2011/0100699 A1* | 5/2011 | Hamazaki ............ H05K 3/0047 174/266 |
| 2013/0213705 A1* | 8/2013 | Suehiro ................ H05K 3/0047 174/262 |
| 2013/0333934 A1* | 12/2013 | Hurwitz .............. H01L 23/3677 174/262 |
| 2015/0189754 A1 | 7/2015 | Bohra et al. |

OTHER PUBLICATIONS

Bohra et al., "Printed Circuit Board Copper Plane Repair," U.S. Appl. No. 15/010,480, filed Jan. 29, 2016.

* cited by examiner

PRINTED CIRCUIT BOARD COPPER PLANE REPAIR

TECHNICAL FIELD

The present disclosure concerns methods of manufacturing printed circuit boards and electronic devices. More specifically, the present disclosure describes devices and methods directed toward regulating power delivery characteristics and electrical resistance of conductive layers in printed circuit boards.

BACKGROUND

The present disclosure describes methods of manufacturing printed circuit boards and devices that may be used to regulate electrical characteristics of printed circuit boards. When manufacturing a printed circuit board it may be desirable to connect electronic components on the top surface of the printed circuit board to conductive paths on top of or within the printed circuit board. These conductive paths may themselves extend to other electrical components attached to the printed circuit board, whether passive components such as capacitors or resistors, or active components such as integrated circuit chips. An electrical component may be attached to a printed circuit board by first drilling a small hole or opening in the printed circuit board and fastening the component by applying solder to mate the electronic component to the printed circuit board and form an electrical connection. In some circumstances, a wire part of an electrical component may be inserted into the opening to facilitate formation of the electrical connection.

The upper portion of the conductive path extends between the top of the printed circuit board and the level of an internal electrical connection point and is part of the minimum-path electrical circuit connection between an electrical component on top of the printed circuit board and the internal electrical connection, extending to downstream electrical components also attached to the printed circuit board. Stubs, or portions of wire or solder that extend beyond the minimum-path electrical circuit may be formed during printed circuit board manufacturing processes. Stubs may be removed from the printed circuit board by drilling or other processes that remove them from within the printed circuit board, truncating their branch in the electrical circuit while leaving the upper portion of the conductive path intact.

Stubs may hinder optimum performance of printed circuit boards. When transmitting a signal across a printed circuit board, transmission speed and transmission clarity may be significant factors in overall board performance. A stub or other portion of an electrical circuit may create configurations where signals transmitted through the wire bifurcate into an original signal that may travel down the intended pathway and a reflected signal that may travel down a branch in the electrical circuit and reflect back to follow the original signal. The delay between the original signal and the reflected signal may cause noise in the signals within the printed circuit board and may slow the response of components attached to the printed circuit board or the data transmitted from the printed circuit board to a computing device where the board is installed.

Reflected signals may be eliminated by drilling out portions of the printed circuit board. When a stub is removed by drilling, typically from the backside of a printed circuit board, the back drilling process may create an array of holes in layers of the conductive plane layers of printed circuit boards used to transmit power across the printed circuit board. These holes may reduce the power transmission efficiency of a printed circuit board and may merit the use of higher voltages or higher currents to achieve desired performance levels of the printed circuit board.

SUMMARY

Embodiments of the disclosure may be directed toward a device that may be inserted into a printed circuit board aperture. The device may have a base having a mounting surface with a length, and a stack having a diameter smaller than the length and fastened to the mounting surface and having a plurality of stack conductive layers, and a plurality of insulating layers separating each of the plurality of stack conductive layers in a manner configured to align the plurality of stack conductive layers with corresponding printed circuit board conductive layers in a printed circuit board when the stack is inserted into an aperture within the printed circuit board.

Embodiments of the disclosure may also be directed toward an assembly made of a printed circuit board and a device inserted into an aperture in the printed circuit board. The printed circuit board may have a back side, a number of insulating layers, a second number of printed circuit board conductive layers, at least one conductive via that penetrates into the printed circuit board, and an aperture substantially concentric with the conductive via that partially penetrates the printed circuit board from the back side. The device may have a base with a mounting surface with a length, and a stack with a diameter smaller than the length and fastened to the mounting surface and with a plurality of stack conductive layers and a plurality of insulating layers separating each of the plurality of stack conductive layers in a manner configured to align the plurality of stack conductive layers with corresponding printed circuit board conductive layers in the printed circuit board when the stack is inserted into an aperture in the printed circuit board. The device may be located in the aperture in the printed circuit board such that at least one layer of the plurality of stack conductive layers makes electrical contact with at least one printed circuit board conductive layer in a printed circuit board.

Embodiments of the disclosure may also be directed toward a method of making the assembly. The method may include creating a device with a base having a mounting surface with a length, and a stack having a diameter smaller than the length and fastened to the mounting surface and having a plurality of stack conductive layers, and a plurality of stack insulating layers separating each of the plurality of stack conductive layers in a manner configured to align the plurality of stack conductive layers with corresponding printed circuit board conductive layers in a printed circuit board when the stack is inserted into an aperture within a printed circuit board. The method may also include creating the aperture in the printed circuit board having a plurality of printed circuit board insulating layers and a plurality of printed circuit board conductive layers, the aperture penetrating at least one layer of the plurality of printed circuit board conductive layers. The method may include inserting the stack into the aperture in a manner to align and to electrically interconnect each of the plurality of stack conductive layers with one of the plurality of printed circuit board conductive layers, and fastening the base to the printed circuit board.

DETAILED DESCRIPTION

Figure 1:
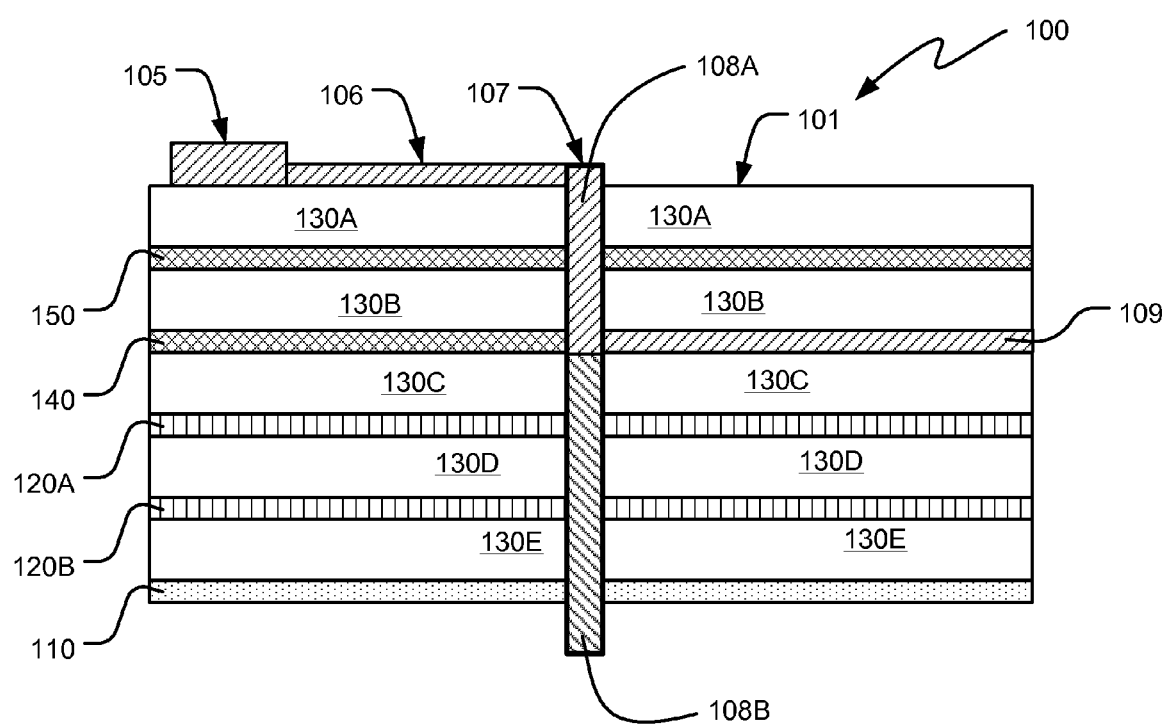
FIG. 1 shows a cross-section of a printed circuit board with a wire stub according to embodiments of the disclosure.

According to some embodiments, printed circuit boards may be modular units that may be added to specialty or general purpose computing devices and other devices to connect electrical circuits within the printed circuit boards to the devices. Electrical components such as resistors, capacitors, and integrated circuit chips may be attached to printed circuit boards by methods such as soldering, which may involve drilling holes in the printed circuit board to receive connecting wires on the electrical components. Holes drilled into a printed circuit board may be drilled from the back side of the board and may penetrate conductive layers or copper plane layers within the printed circuit board that deliver electrical power to different portions of the printed circuit board and to electrical components attached to the printed circuit board. When a conductive layer or copper plane layer has holes drilled in it, it may exhibit greater electrical resistance than a conductive layer or copper plane layer without holes drilled in it. Inserting a plug device into holes drilled in a printed circuit board may lower the electrical resistance exhibited by the printed circuit board if the plug device contains a conductive layer configured to align with and to electrically connect to a conductive layer or copper plane layer in the printed circuit board after insertion. The plug device may include a single aperture-filling stack or may include many aperture-filling stacks of insulating and conductive layers and may be permanently fastened to the back side of the printed circuit board after stack insertion.

According to some embodiments, printed circuit boards may be manufactured by adhering alternating layers of insulating and conductive materials on top of each other in order to form a laminated stack of layers with a three-dimensional array of conductive paths and electrical circuitry embedded in the board structure. Some of these layers may consist of insulating material with holes or apertures drilled in them to allow wires from circuit elements to be inserted into the printed circuit board. Other layers may include complete sheets or planes of conductive material to deliver power across the printed circuit board to integrated circuits, passive circuit elements, environmental sensors, and other circuit elements that may have been attached to the printed circuit board. Some layers may include pluralities of conductive metallic paths that extend between individual holes to route signals or power to circuit board components. Passive electrical components such as resistors or capacitors as well as active electrical components such as integrated circuit computer chips may be connected to the top or bottom sides of a printed circuit board in such a way that the internal conductive circuitry of the printed circuit board allows them to communicate with each other to perform specific tasks.

Vias may be drilled in the laminated printed circuit board stack to permit the perpendicular insertion of conductive wiring to route power or signals to circuit components. The wiring inserted into these apertures may be affixed in place by soldering, and in some cases a portion of wire and solder may protrude from the front or back sides of a printed circuit board. The wire or conductive path through the printed circuit board may have two portions, an upper portion and a lower portion, that are distinguished by their position relative to point of the path's intersection with the internal conductive path. The upper portion may run from the intersection point upward to a circuit element on the front or back of the printed circuit board, while the lower portion may run downward and terminate without completing an electrical connection. The lower portion may also be called a stub, even if it does not protrude beyond the front or back of a printed circuit board. It may, in some circumstances, be desirable to remove stubs, protruding or non-protruding, if the stub adversely affects the performance of the printed circuit board's circuit. Not all stubs in a printed circuit board electrical circuit may be removed according to embodiments of the present disclosure.

FIG. 1 shows a cross section of a printed circuit board 100 consistent with embodiments of the present disclosure. Printed circuit board 100 may be made of a plurality of insulating layers 130A, 130B, 130C, 130D, and 130E, and a plurality of printed circuit board conductive layers such as conductive line layers 140 and 150 in addition to conductive sheet layers 120A and 120B. Printed circuit board 100 may also have a back side with a backing layer 110. Backing layer 110 may be conductive or non-conductive, depending on the design requirements of printed circuit board 100. Conductive line layers 140 and 150 may include insulating materials, adhesive materials, and an internal conductive line 109 that traverses printed circuit board 100. Each conductive line layer 140 and 150 may be layered between adjacent insulating layers such as 130A, 130B, and 130C. Conductive lines in a printed circuit board may be made substantially or entirely of copper or other conductive metals and metal alloys.

In certain embodiments, conductive sheet layers 120A and 120B may be sheets of conductive material, such as copper or other metals or metal alloys, that cover large portions of the printed circuit board area to conduct electrical power across printed circuit board 100. Conductive sheet layer 120A may be layered between adjacent insulating layers 130C and 130D.

A circuit component 105 on the top side 101 of printed circuit board 100 may be electrically connected to a conductive via 107 that extends partially or completely through printed circuit board 100 by an upper conductive line 106 also located on the top side 101 of printed circuit board 100. Conductive via 107 may include a conductive wire, solder, or a conductive metallic prong extending from an electrical component on the top side 101 of printed circuit board 100. Examples of electrical components may include passive components such as resistors, capacitors, and inductors as well as active components such as integrated circuits and computer chips that serve specific functions for the printed circuit board's intended purpose.

Conductive via 107 may be divided into two segments: an upper segment 108A and a lower segment 108B. The dividing line between upper segment 108A and lower segment 108B may be in different locations in conductive via 107 in different embodiments of printed circuit board 100, but may generally correspond to the level at which upper segment 108A intersects with internal conductive line 109. Lower segment 108B may be described as a stub, meaning that the conductive path represented by lower segment 108B does not lead to an electrical component such as circuit component 105, nor does it lead to an internal electrical connection such as internal conductive line 109. When an electrical signal is transmitted through the conductive path in printed circuit board 100, a stub such as lower segment 108B may add to electrical noise by allowing reflections to travel down the stub and reflecting back down the conductive pathway toward a circuit component 105 on printed circuit board 100, lowering overall performance levels of printed circuit board 100.

Figure 2:
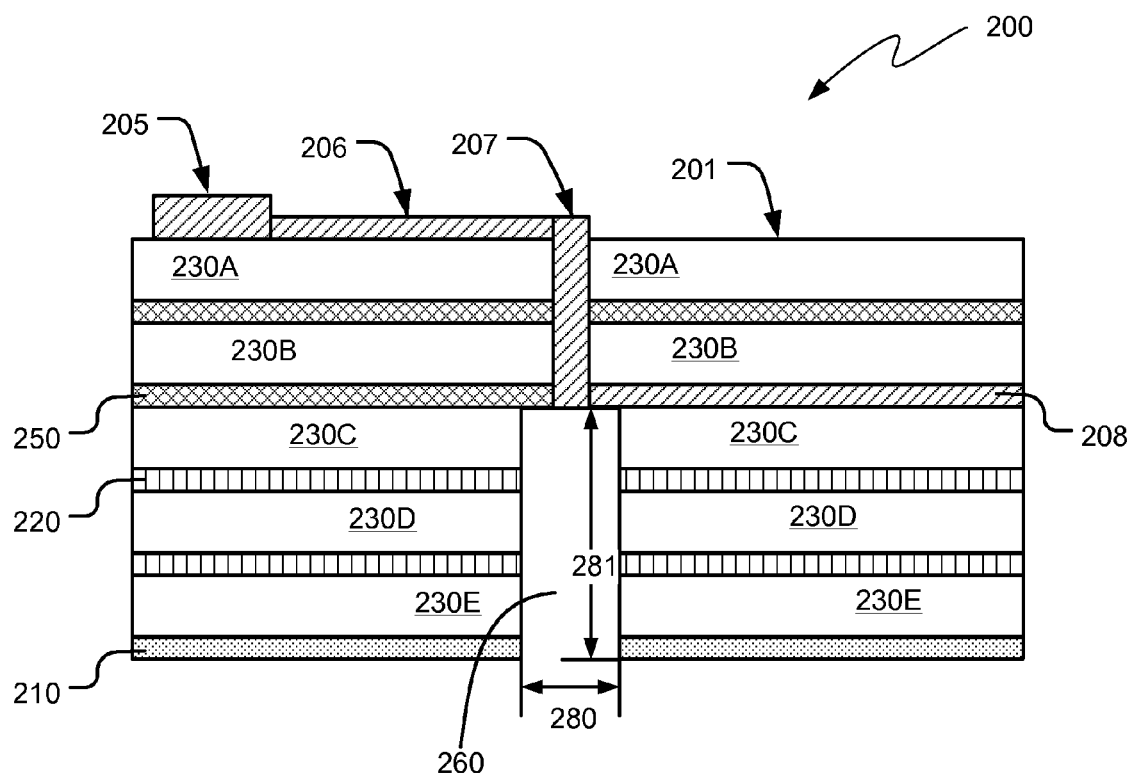
FIG. 2 shows a cross-section of the printed circuit board with a back drilled aperture in the printed circuit board, according to embodiments of the invention.

FIG. 2 shows a printed circuit structure consistent with embodiments of the present disclosure where an aperture penetrates the back of printed circuit board 200. Printed circuit board 200 may have a top side 201, a number of insulating layers 230A, 230B, 230C, 230D, and 230E, a back layer 210, a second number of stack conductive layers including least one conductive line layer 250, and at least one conductive sheet layer 220. An internal conductive line 208 may be found within conductive line layer 250. Conductive line layer 250 may be layered between adjoining insulating layers 230A and 230B. Conductive sheet layer 220 may be layered between adjoining insulating layers 230C and 230D, and back layer 210 may be connected to conductive layer 230E and may further be conductive or non-conductive according to the needs of the particular embodiment of printed circuit board 200.

A circuit component 205 located on the top side 201 may be connected to conductive via 207 that penetrated several insulating layers 230A and 230B of printed circuit board 200 by means of an upper conductive line 206 that electrically connects to both circuit component 205 and conductive via 207. Conductive via 207 may also electrically connect to internal conductive line 208 within printed circuit board 200. An aperture 260 may penetrate printed circuit board 200 beginning at the back layer 210. Aperture 260 may have a diameter 280 and a first depth 281 as it penetrates printed circuit board 200. In general, aperture 260 may penetrate printed circuit board 200 as a by product of eliminating a stub within printed circuit board 200 and to improve overall signal transmission characteristics. Aperture 260 may penetrate through multiple insulating layers 230E, 230D, and 230C, as well as penetrate conductive sheet layer 220. In some embodiments of the present disclosure aperture 260 may also penetrate to the level of a conductive line layer 250, so long as the aperture does not eliminate portions of conductive via 207 that are required for an electrical connection between circuit component 205, upper conductive line 206, and an intended internal electrical pathway within the body of printed circuit board 200.

Figure 3:
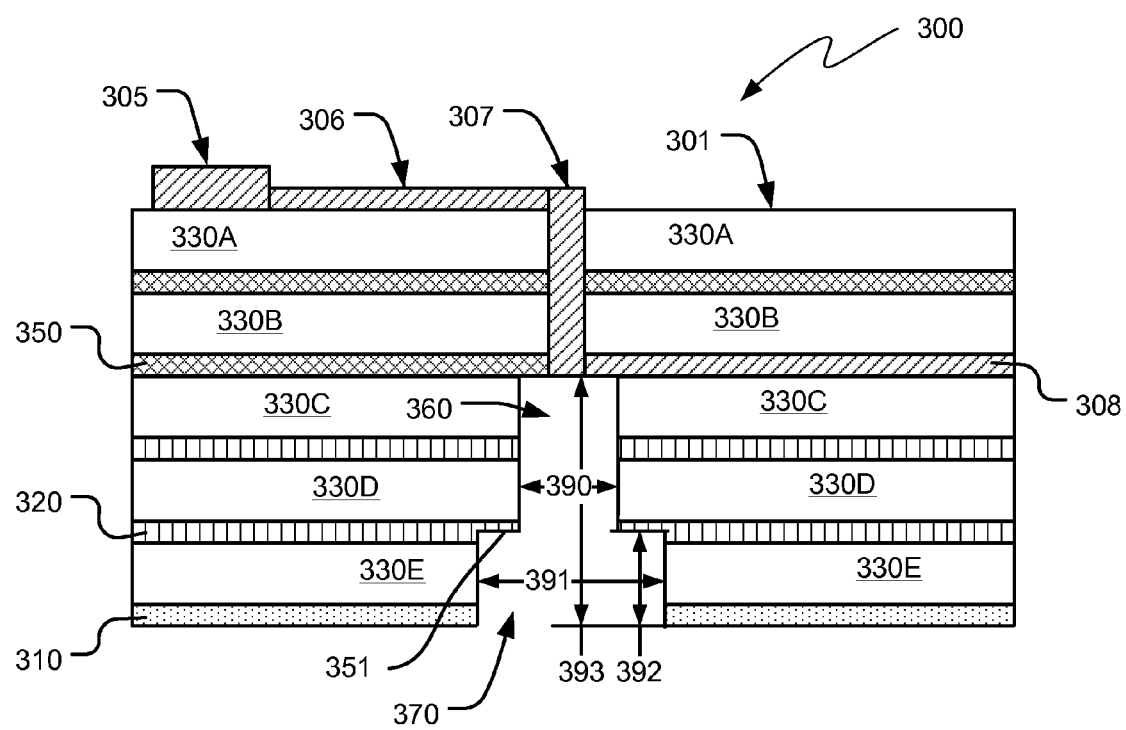
FIG. 3 shows cross-section of the printed circuit board with a back drilled hole having two separate diameters, according to embodiments of the invention.

FIG. 3 portrays a cross section of a printed circuit board 300 with a back-drilled aperture having an upper region 360 and a lower region 370 according to embodiments of the invention. A circuit component 305 on the top side 301 of printed circuit board 300 may be connected to an internal conductive line 308 by an upper conductive line 306 on the top side 301 and a conductive via 307 that penetrates into printed circuit board 300 to the level of internal conductive line 308. Conductive via 307 may penetrate through multiple insulating layers 330A and 330B in order to connect with internal conductive line 308. In some embodiments, the aperture may penetrate at least one conductive line layer in order to reach the juncture of a conductive via and an internal conductive line. Portions of conductive via 307 that extended beyond the level of internal conductive line 308 toward or through back layer 310 may have been drilled out for the formation of an aperture extending from back layer 310 into printed circuit board 300.

Some embodiments may include apertures with an upper region 360 and a lower region 370 that is closer to back layer 310. Upper region 360 and lower region 370 may penetrate multiple insulating layers 330E, 330D and 330C as well as a conductive sheet layer 320. In some embodiments of the present disclosure, the upper region 360 of the aperture may also penetrate printed circuit board 300 to the level of internal conductive line 308 or beyond, possibly even penetrating a conductive line layer 350.

Upper region 360 of the aperture may have a diameter 390 and a first depth 393 to which it penetrates printed circuit board 300, and lower region 370 of the aperture 370 may have a second diameter 391 and a second depth 392 to which it penetrates printed circuit board 300. It may be the case that the diameter 390 of the upper region 360 is smaller than the second diameter 391 of the lower region 370. The point where upper region 360 and lower region 370 meet may have a step 351 where the width of the aperture suddenly changes. Step 351 may occur at the level of conductive sheet layer 320 or within an insulating layer 330D or 330E, according to design parameters for printed circuit board 300.

One consequence of drilling an aperture in the back of a printed circuit board is that the aperture may increase the resistance associated with power delivery through a conductive sheet layer within the printed circuit board. As more apertures are drilled in a printed circuit board, the effect on the board's electrical characteristics may become more pronounced.

Figure 4:
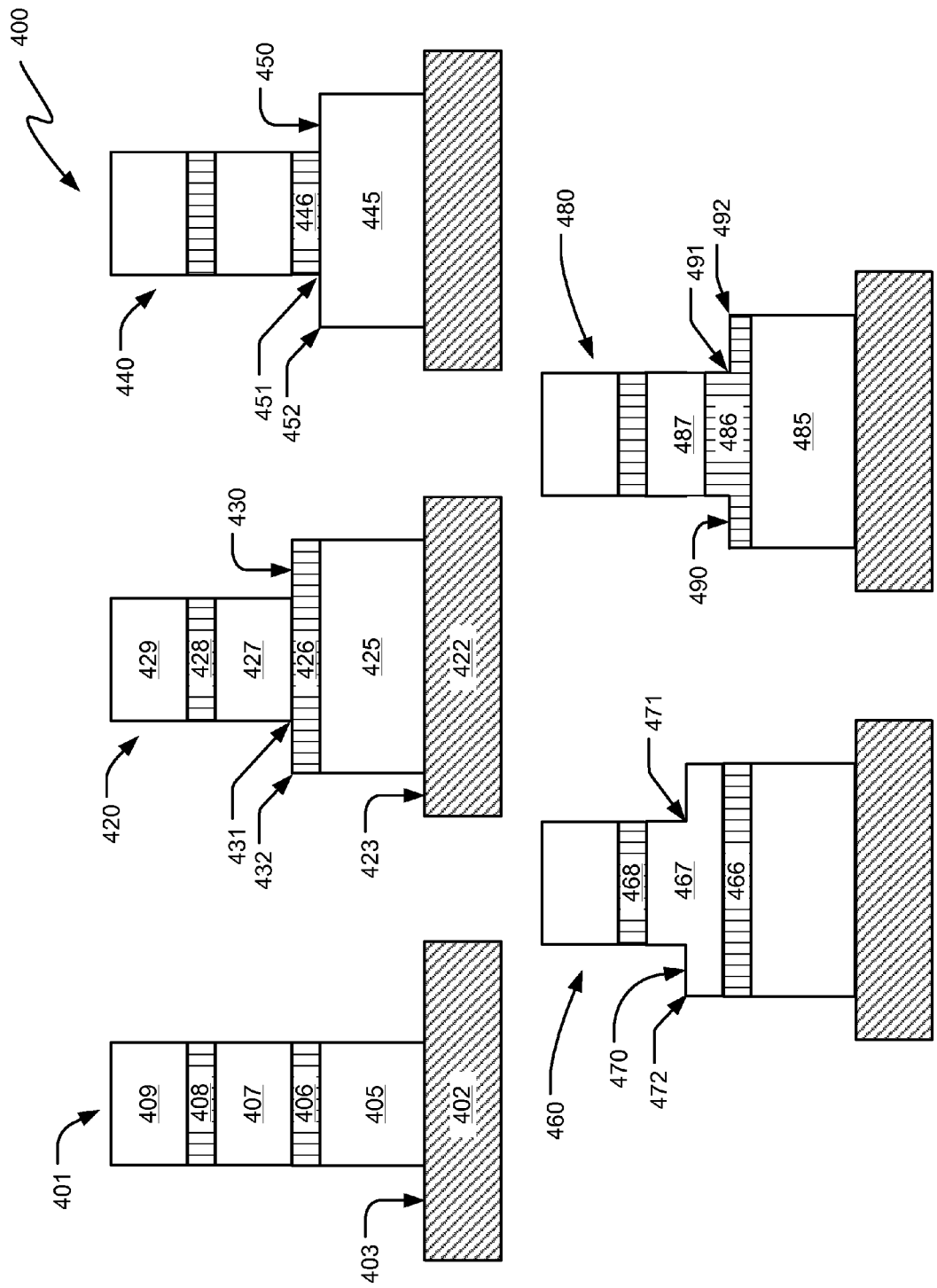
FIG. 4 shows the cross sections of that may be used to fill holes drilled in printed circuit board, according to embodiments of the invention.

FIG. 4 shows plug devices 400 consistent with embodiments of the present disclosure. A plug may include a stack 401 connected to a base 402 on a mounting surface 403. Stack 401 may contain a plurality of insulating layers 405, 407 and 409 that separate a plurality of stack conducting pieces 406 and 408. In some embodiments, insulating layers and stack conductive layers may alternate, while in others there may be more than one insulating layer between stack conductive layers. Stack conductive layers 406 and 408 may be configured to match the physical dimensions of printed circuit board conductive layers and printed circuit board insulating layers in embodiments of the disclosure, including the thicknesses of insulating and conductive layers, the diameters and circumferences, and the number of layers within the stack and printed circuit board aperture. Insulating layers in the stack may closely match the thickness of individual printed circuit board insulating layers, or they may be designed to span multiple insulating layers of the printed circuit board when placed in a stack.

In some embodiments, printed circuit board apertures may be created by drilling to a first depth to create an upper aperture region having a first diameter and having a first side, followed by drilling substantially concentrically a second time to a second depth to create a lower aperture region, closer to the back layer, with a second diameter and having a second side. These two-diameter apertures may be filled by two-diameter plugs with stacks such as stacks 420, 440, 460, and 480. For example, a two-diameter aperture with an upper aperture region and a lower aperture region may be filled with a two-diameter plug where the upper plug region has the first diameter and a first edge that touches the first side of the upper aperture region and the lower plug region has the second diameter and a second edge that touches the second side of the lower aperture region, and the level at which the first diameter changes to the second diameter in the aperture matches the level at which the first diameter changes to the second diameter on the stack. The boundary position between the upper plug region and the lower plug region, where the first diameter transitions to the second diameter, has an interfacial surface on the top of the lower stack region that may make contact with the surface of the aperture where the first diameter changes to the second diameter.

A plug may have a base 422 with a mounting surface 423 to which a stack 420 is attached. Stack 420 may contain insulating layer 425 attached to the mounting surface 423 with stack conductive layer 426 attached to the top of insulating layer 425. Insulating layer 425 and stack conductive layer 426 may have a second diameter and a second edge that corresponds with a lower aperture region, and interfacial surface 430 on top of the lower stack region with a corner 431 and a shoulder 432 on interfacial surface 430. The distance between interfacial surface 430 and mounting surface 423 may correspond to the depth of the aperture lower region. Shoulder 432 may be located at the juncture of interfacial surface 430 and the second edge, while the corner 431 may occur where interfacial surface 430 meets the first edge of insulating layer 427 attached to stack conductive layer 426. In some embodiments, insulating layer 427 may further be attached to stack conductive layer 428 and insulating layer 429 such that the first diameter and first edge of the upper stack region corresponds to the first diameter and first side of upper aperture region in the two-diameter aperture in a printed circuit board. The thicknesses of insulating layers 425 and 427 and of stack conductive layers 426 and 428 may be adjusted to align stack conductive layers 426 and 428 with corresponding conductive material within the printed circuit board to lower the electrical resistance of conductive sheet layers or copper plane layers.

The boundary position of the interfacial surface between the upper stack region and lower stack region may vary in different embodiments. For example, interfacial surface 430 may occur directly atop a stack conductive layer 426 with corner 431 and shoulder 432 being located on the top of the stack conductive layer 426. In certain embodiments, stack 440 may have an insulating layer 445 such that interfacial surface 450 corresponds to the top surface of insulating layer 445 and does not include portions of stack conductive layer 446, and corner 451 and shoulder 452 occur on the top surface of insulating layer 445. In certain embodiments, an upper stack region and a lower stack region can be concentrically positioned for insertion into a printed circuit board aperture.

The interface surface may occur at a boundary position that is found not at the edge of stack conductive layers and insulating layers, but within the thickness of a stack conductive layer or insulating layer. Stack layers having boundary positions within a layer may be called stepped layers and may have an upper layer part and a lower layer part, the upper layer part having the first edge and the first diameter of the upper stack region, and the lower layer part having the second edge and the second diameter of the lower stack region. In some embodiments, the stepped layer may be stepped insulating layer 467 which may have conducting layers 468 and 466 above and below it in the stack and have corner 471 and shoulder 472 on interfacial surface 470. In other embodiments, the stepped layer may be stepped conductive layer 486 with insulating layers 487 and 485 above and below stepped conductive layer 486, and with corner 491 and shoulder 492 on interfacial surface 490. When the stepped layer is stepped conducting layer 486, the additional conductive surface area of interfacial surface 490 may improve an electrical contact to the printed circuit board conductive layer with which it aligns.

In some embodiments, the interfacial surface may be perpendicular to the major axis of the stack, may be perpendicular to the first edge of the upper stack region and the second edge of the lower stack region. In other embodiments the interfacial surface may be angled slightly to reflect a complimentary angle within the aperture of a printed circuit board, the angle being the formed by an angled drill bit tip during the aperture formation process.

Figure 5:
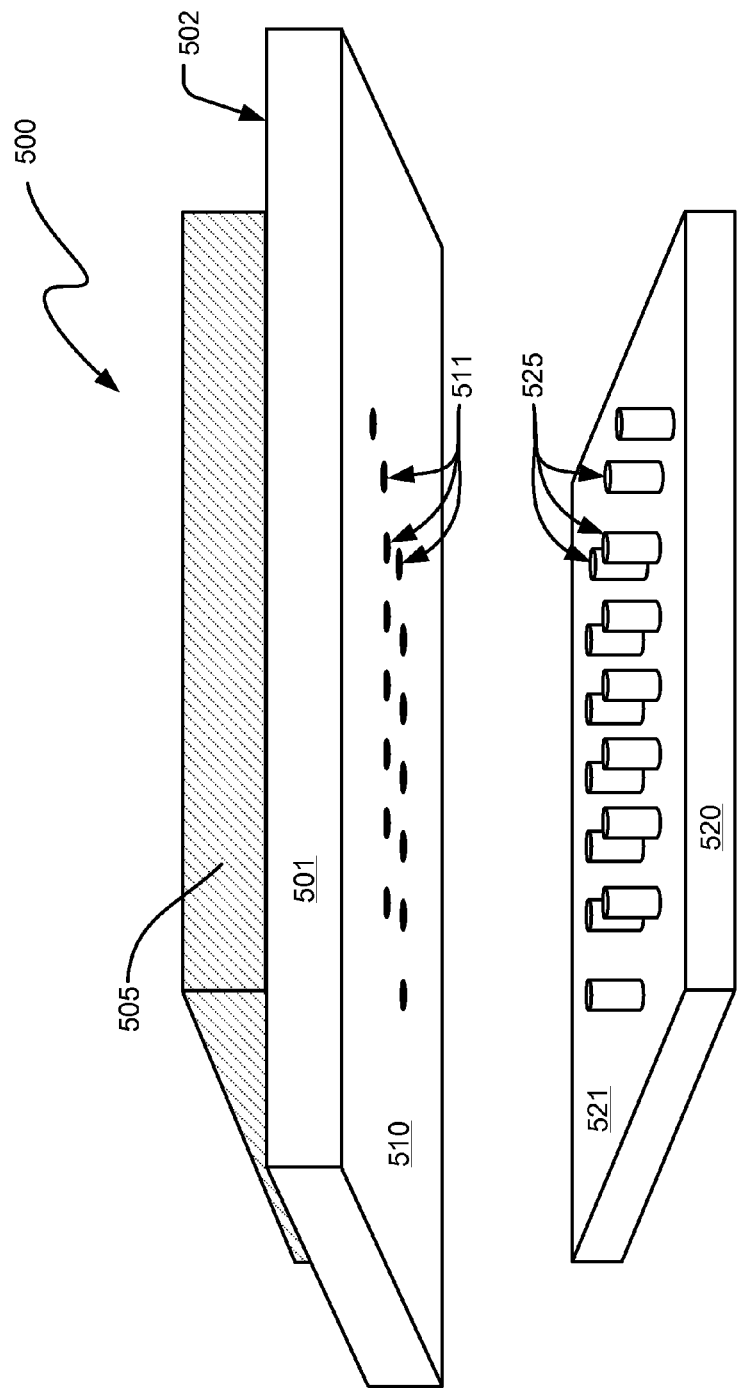
FIG. 5 shows multiple inserts or back drilled plugs assembled on a substrate prior to insertion into holes drilled in a printed circuit board, according to embodiments of the invention.

FIG. 5 shows the parts of an assembly 500 that may be formed when a base 520 configured with a plurality of stacks 525 arranged to fit into back-drilled via apertures 511 in a printed circuit board 501, consistent with embodiments of the present disclosure. A printed circuit board 501 with a top side 502 may have an integrated circuit 505 electrically connected to the top side 502. Printed circuit board 501 may also have a bottom 510 with an array of back drilled apertures 511 located at positions of conductive vias which extends through printed circuit board 501 and which have been drilled out to eliminate stubs. A base 520 may have a plurality of stacks 525 adhered to the mounting surface 521 of base 520. The stacks 525 may be positioned on the mounting surface 521 to correspond with locations of back drilled apertures 511 on the bottom 510 of printed circuit board 501. During a manufacturing process, base 520 may be positioned beneath printed circuit board 501 and the plurality of stacks 525 may be concentrically aligned with corresponding back drilled apertures 511 in printed circuit board 501. Stacks 525 may be inserted into the back drilled apertures 511 and base 520 may be fastened to the bottom 510 of printed circuit board 501 in order to retain base 520 in place, holding stack conductive layers within the plurality of stacks 525 in contact with conductive layers within printed circuit board 501 to adjust electrical properties of printed circuit board 501.

Figure 6:
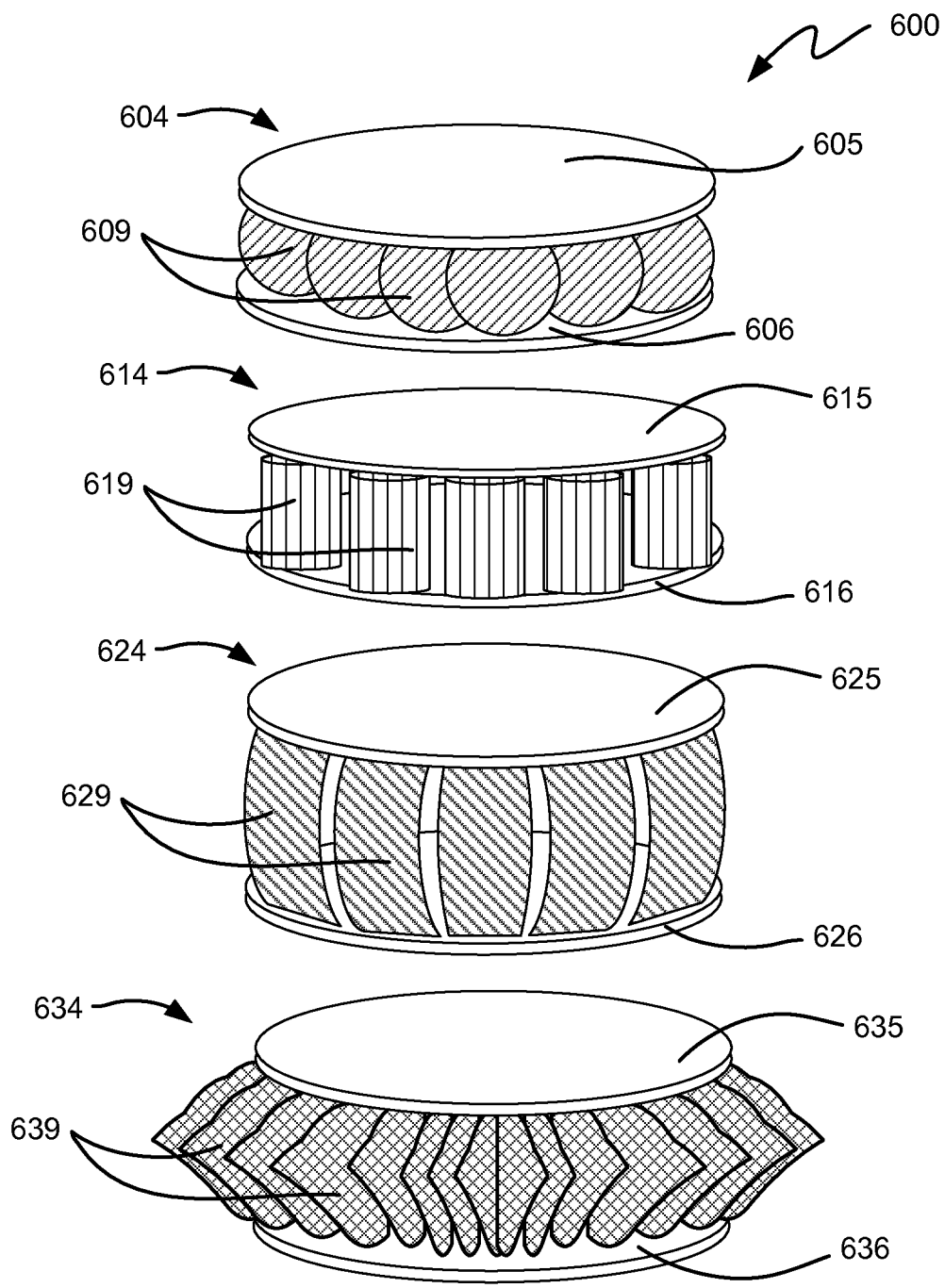
FIG. 6 shows structural details of conductive assemblies that may be incorporated into a plug, according to embodiments of the invention.

FIG. 6 shows a set 600 of example configurations of a stack conductive assembly within a plug stack, consistent with embodiments of the present disclosure. Although some embodiments may use a stack conductive layer made of a solid piece of metal such as copper or a copper alloy, alternative embodiments may also be made of stack conductive assemblies made of conductive disks with a compressible and conductive expansive element layered between. The top disk, bottom disk, and expansive element in a stack conductive assembly may be made of copper, copper alloys, or other metals or metal alloys. In some embodiments of the invention, a stack conductive assembly may be substituted for a solid metallic stack conductive layer in order to provide a different surface on the stack for making electrical contact with the inside of the printed circuit board aperture. In certain embodiments, a stack conductive layer 604 may include top disk 605 and bottom disk 606 with expansive element 609 made of a plurality of spheres positioned between top disk 605 and 606. Alternative embodiments may also substitute rounded aspherical elements for spheres within the expansive element 609.

According to embodiments, a stack conductive layer 614 may include top disk 615, bottom disk 616 and a plurality of cylinders 619 positioned between top disk 615 and bottom disk 616. In certain embodiments, stack conductive layer 624 may include top disk 625, bottom disk 626 and an expansive element 629 made of at least a plurality of flexible metal ribbons attached to top disk 625 and bottom disk 626. Various embodiments are directed toward a stack conductive layer 634 that may include top disk 635, bottom disk 636, and expansive element 639 made of a plurality of fins 639 positioned between top disk 635 and bottom disk 636.

According to embodiments, various other types of expansive elements can be used in order to make contact with a conductive material within a printed circuit board. Once inserted, the conductive material can surround the embodiments 604, 614, 624, and 634 of the stack conductive layer. Contact may be enhanced by compressing the disks together, or may occur by inserting the conductive layer and having an already-protruding piece score the printed circuit board to firmly touch any conductive material in the device. The disks and expansive elements may be made entirely or substantially of copper of other metal alloys in order to enhance properties of electrical conductivity and ductility.

Figure 7:
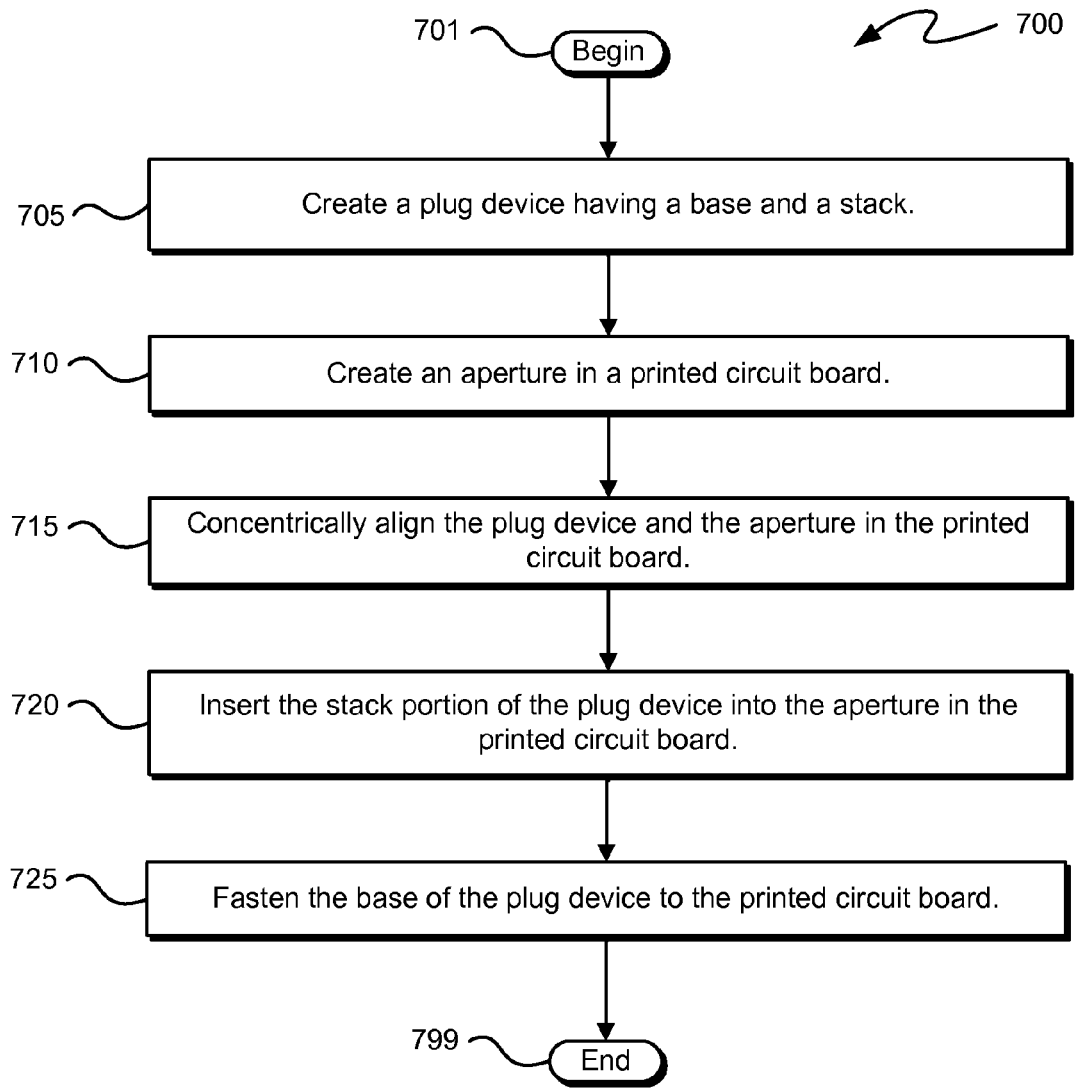
FIG. 7 shows a method of manufacturing an assembly having apertures drilled in the back of a printed circuit board that are filled by plug structures, according to embodiments of the invention.

FIG. 7 describes a method 700 of making an assembly of a printed circuit board and a plug device that includes a stack and a base, the plug stack being inserted into an aperture in the printed circuit board according to embodiments of the present disclosure. The method begins with block 701. A manufacturer may create a plug device with a base and a stack as described in block 705. The base may be a nonconductive flat surface to which a stack is fastened in order to position and orient the stack for subsequent steps. Embodiments of the invention may have plug devices with either a single-diameter stack or a two-diameter stack. The stack may include a plurality of insulating layers and a plurality of stack conductive layers configured, by adjusting their diameters and thicknesses, to align one or more of the plurality of stack conductive layers with a corresponding printed circuit board conductive layer when the stack may subsequently be inserted into a printed circuit board aperture. The stack conductive layers may make electrical contact with copper planes or other conductive materials in the printed circuit board to reduce resistance as electrical power is transmitted across the conductive sheet or copper plane levels in the printed circuit board. Each of the plurality of stack conductive layers may be separated by one or more insulating layers to prevent short circuits between stack conductive layers and to property position the stack conductive layers for insertion into printed circuit board apertures.

The method may continue by creating an aperture in a multi-layer printed circuit board to eliminate stubs as described in block 710. The aperture may penetrate one or more conductive layers in the printed circuit board. In certain embodiments, a single aperture may be created in the printed circuit board. In other embodiments, several apertures may be created in the printed circuit board, as for the purposes of eliminating stubs and wire from the back side of the printed circuit board.

The method may include a step wherein the stack is concentrically aligned with the aperture in the printed circuit board, as described in block 715. When the base has multiple stacks attached to it, each individual stack may be concentrically aligned with a corresponding printed circuit board aperture configured to it. The stack portion of the plug device may then be inserted into the printed circuit board aperture, as described in block 720.

Following the insertion step, the base of the plug device may be fastened to the printed circuit board to retain the stacks within their apertures, as described in block 725. According to embodiments of the invention, the fastening step may be accomplished by using an adhesive between the base and the printed circuit board, or by fusing the base to the printed circuit board, or by applying a film of retaining material that may cover part or all of the base and adhere to the printed circuit board beyond the mounting surface sides. In other embodiments, the base may contain blind openings and be retained in position by screws that fit into the printed circuit board or other threaded part of the assembly. The method ends with block 799.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments herein.

What is claimed is:

1. A device, comprising:
    a base having a mounting surface with a length; and
    a stack having a first diameter smaller than the length and fastened to the mounting surface and having
        a plurality of stack conductive layers, and
        a plurality of insulating layers separating each of the plurality of stack conductive layers in a manner configured to align the plurality of stack conductive layers with corresponding printed circuit board conductive layers in a printed circuit board when the stack is inserted into an aperture within the printed circuit board.

2. The device of claim 1, wherein the stack conductive layers are made substantially of copper.

3. The device of claim 1, wherein at least one stack conductive layer in the plurality of stack conductive layers further comprises a stack conductive assembly having a top disk, a bottom disk, and an expansive element positioned between and attached to the top disk and the bottom disk.

4. The device of claim 3, wherein the expansive element is selected from the group consisting of a plurality of spheres, a plurality of cylinders, a plurality of flexible ribbons, and a plurality of fins.

5. The device of claim 1, wherein the stack further comprises
    an upper stack region with the first diameter and a first edge; and
    a lower stack region with
        a second diameter larger than the first diameter of the upper stack region,
        a second edge, and
        an interfacial surface,
    the stack having
        a corner where the first edge meets the interfacial surface and
        a shoulder where the second edge of the lower stack region meets the interfacial surface.

6. The device of claim 5, wherein the interfacial surface is located at a boundary position between one of the plurality of stack conductive layers and one of the plurality of insulating layers.

7. The device of claim 5, further comprising
    a stepped layer having
        an upper layer part with the first diameter and the first edge of the upper stack region,
        a lower layer part with the second diameter and the second edge of the lower stack region, and
        the interfacial surface.

8. The device of claim 5, wherein the stepped layer is one of the plurality of stack conductive layers.

9. The device of claim 1, further comprising a plurality of stacks fastened to the base and positioned to concentrically align with a plurality of apertures within the printed circuit board.

10. An assembly, comprising:
a printed circuit board having
- a back side,
- a number of insulating layers,
- a second number of printed circuit board conductive layers,
- at least one conductive via that penetrates into the printed circuit board, and
  - an aperture substantially concentric with the conductive via that partially penetrates the printed circuit board from the back side; and a device having
- a base with a mounting surface with a length; and
- a stack with
  - a diameter smaller than the length and fastened to the mounting surface and with
  - a plurality of stack conductive layers, and
  - a plurality of insulating layers separating each of the plurality of stack conductive layers in a manner configured to align the plurality of stack conductive layers with corresponding printed circuit board conductive layers in the printed circuit board when the stack is inserted into an aperture in the printed circuit board, the device being located within the aperture in the printed circuit board such that at least one of the plurality of stack conductive layers makes electrical contact with at least one printed circuit board conductive layer in a printed circuit board.

11. The assembly of claim 10, further comprising a plurality of stacks on the base, the plurality of stacks configured to concentrically penetrate a plurality of apertures in the printed circuit board.

\* \* \* \* \*